United States Patent [19]

Walls et al.

[11] Patent Number: 4,618,562
[45] Date of Patent: Oct. 21, 1986

[54] AQUEOUS DEVELOPABLE LITHOGRAPHIC PRINTING PLATES CONTAINING AN ADMIXTURE OF DIAZONIUM SALTS AND POLYMERS AND COMPOSITION THEREFOR

[75] Inventors: John E. Walls, Hampton; Shuchen Liu, Clinton, both of N.J.

[73] Assignee: American Hoechst Corporation, Somerville, N.J.

[21] Appl. No.: 686,778

[22] Filed: Dec. 27, 1984

[51] Int. Cl.$^4$ .................. G03C 1/60; G03C 1/54; G03C 1/94; G03F 7/08
[52] U.S. Cl. .................. 430/157; 430/158; 430/160; 430/161; 430/302
[58] Field of Search .............. 430/175, 176, 157, 158, 430/160, 161

[56] References Cited

U.S. PATENT DOCUMENTS

| | | | |
|---|---|---|---|
| 2,980,534 | 4/1901 | Printy et al. | 430/289 |
| 3,679,419 | 7/1972 | Gillich | 430/175 |
| 3,849,392 | 11/1974 | Steppan | 430/175 |
| 3,890,152 | 6/1975 | Ruckert et al. | 430/175 |
| 4,294,905 | 10/1981 | Okishi et al. | 430/175 |
| 4,436,804 | 3/1984 | Walls | 430/175 |
| 4,472,494 | 9/1984 | Hallman et al. | 430/175 |
| 4,511,640 | 4/1985 | Liu | 430/175 |

FOREIGN PATENT DOCUMENTS

| | | | |
|---|---|---|---|
| 1313777 | 4/1973 | United Kingdom | 430/175 |
| 1525757 | 9/1978 | United Kingdom | 430/160 |

Primary Examiner—Charles L. Bowers, Jr.
Attorney, Agent, or Firm—Richard S. Roberts; John P. Blasko

[57] ABSTRACT

An improved negative working photographic element is prepared by coating a suitable substrate with a photosensitive composition comprising an admixture of two light sensitive diazonium salts and a binder composition comprising a polyvinyl acetate resin and a styrene/maleic acid half ester copolymer. Upon imagewise exposure of the element to actinic radiation through a suitable mask, the unexposed portions are removable with an aqueous alkaline developer.

14 Claims, No Drawings

AQUEOUS DEVELOPABLE LITHOGRAPHIC PRINTING PLATES CONTAINING AN ADMIXTURE OF DIAZONIUM SALTS AND POLYMERS AND COMPOSITION THEREFOR

BACKGROUND OF THE INVENTION

The present invention relates to improved photographic elements. More particularly, this invention relates to an improved lithographic printing plate which employs novel photosensitive compositions which are developable in aqueous developers.

Most photographic elements comprise a metal sheet substrate which is coated with a light sensitive diazonium compound in admixture with suitable binding resins, colorants, stabilizers, exposure indicators, surfactants, and the like.

While the art discloses a plethora of photosensitive compositions useful for lithographic purposes, their serviceability is limited by the need to develop them with solutions containing substantial amounts of organic solvents. This is undesirable since these solvents are costly and their effluent is environmentally harmful.

The present invention seeks to reduce or eliminate the need for such solvents in lithographic systems by providing a photographic element with a coating using a particular class of binding resins such that the exposed element is developable with a substantially aqueous based developer composition. Simultaneously the element shows no substantial attack to its image areas and the removed non-image area resins are substantially not re-deposited or re-adhered back onto the element after removal.

The invention also seeks to reduce the time necessary to effectively expose or insolubilize the coating by substantially increasing its light sensitivity while retaining high image resolution and extended press run performance.

SUMMARY OF THE INVENTION

The present invention provides a photographic element having high light sensitivity which is capable of being developed with a substantially aqueous developer after being imagewise exposed to actinic radiation. The coating composition comprises an admixture of two negative working, light sensitive diazonium salt types and a binding resin composition comprising or consisting essentially of a polyvinyl acetate polymer and a styrene/maleic acid half ester copolymer.

By the term "substantially aqueous developer" it is meant, one which contains aqueous solutions of salts and surfactants and less than about 10% by weight of organic solvents. Preferably the developer contains no more than about 5%, more preferably no more than about 2% and most preferably 0% of such organic solvents.

The Type 1 diazo ingredient is a light sensitive, substantially linear polymeric diazonium reaction compound comprising repeating units of the condensation product of each of the general types $E^+X^-$ and Q, in which $E^+X^-$ is a radical of the compound of the general formula:

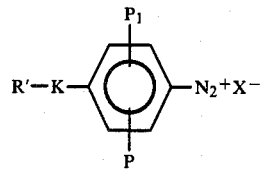

wherein:
—K— is selected from the group consisting of

—S—, —O—, and —CH$_2$—, or is absent;
R' is selected from the group consisting of phenyl and C$_1$ to C$_4$ alkyl substituted phenyl;
P and P$_1$ are selected from the group consisting of C$_1$ to C$_4$ alkyl, methoxy, ethoxy, butoxy, or H;
P$_1$ may be the same as P or different; and
X$^-$ is an anion;
and Q is a radical of an oligomer having the structure:

wherein:
R is selected from the group consisting of

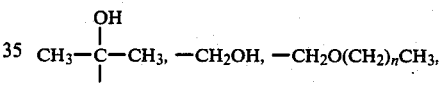

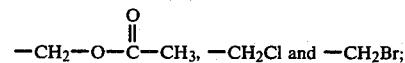

n is an integer from 0 to 3;
M is an aromatic radical selected from the group consisting of aromatic hydrocarbons, diaryl ethers, diaryl sulfides, diaryl sulfones, diaryl amines, diaryl ketones and diaryl diketones;
m is 1 to 6;
Y is selected from the group consisting of —CH$_2$— or —CH$_2$—O—CH$_2$—bridge; and
T is the same as R when Y=—CH$_2$— and H— when Y=—CH$_2$—0—CH$_2$—.

The foregoing diazonium compound is prepared by a two-step process consisting essentially of forming a precondensed oligomer component Q and reacting said component Q with radical $E^+X^-$ such that the ratio of M to $E^+X^-$ is at least 2:1. This diazonium compound is capable of being substantially insolubilized when it is coated alone on a suitable substrate and exposed to a suitable light source at an energy level of 4mJ/cm$^2$.

The distance between diazonium groups in said polymeric diazonium compound is at least 5 Å and it has an average molecular weight of up to about 60,000.

The foregoing class of diazonium compounds is more fully described in U.S. Pat. No. 4,436,804 which is incorporated herein by reference.

The Type 2 diazo class is a condensation product of an aromatic diazonium compound which comprises reacting in the absence of added paraformaldehyde at least one A—N₂X compound and at least one B₁ compound of the formula $$E(-CHR_a-OR_b)_m$$

in which A—N₂X is a radical of a compound selected from the group consisting of a compound of the formula

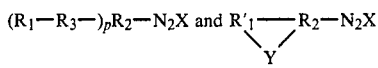

wherein
- R₁ is a phenyl or naphthyl group
- R'₁ is a phenylene or naphthylene group
- R₂ is a phenylene group
- R₃ is a single bond or one of the groups
  - —(CH₂)$_q$—NR₄—
  - —O—(CH₂)$_r$—NR₄—
  - —S—(CH₂)$_r$—NR₄—
  - —S—CH₂—CO—NR₄—
  - —O—R₅—O—
  - —O—
  - —S— or
  - —CO—NR₄— the left-hand free valence of the specified groups is attached to R₁ and the right-hand free valence is attached to R₂, wherein
- q is a number from 0 to 5
- r is a number from 2 to 5
- R₄ is selected from the group consisting of hydrogen, alkyl with 1 to 5 carbon atoms, aralkyl with 7 to 12 carbon atoms, and aryl with 6 to 12 carbon atoms,
- R₅ is an arylene group having 6 to 12 carbon atoms
- Y is one of the groups —NH—, and —O—
- X is an anion
- p is a number from 1 to 3
- E is a radical obtained by splitting off of m H atoms from a compound free of diazonium groups selected from the group consisting of aromatic amines, phenols, thiophenols, phenyl ethers, aromatic thioethers, aromatic heterocyclic compounds, aromatic hydrocarbons and organic acid amides,
- R$_a$ is selected from the group consisting of hydrogen and phenyl,
- R$_b$ is selected from the group consisting of hydrogen and alkyl C$_n$H$_{2n+1}$CO— wherein n is from 0 to 3 and a phenyl group, and
- m is an integer from 1 to 10 in a strongly acidic condensation medium and under condensation conditions sufficient to produce a polycondensation product of an aromatic diazonium compound containing, on the average, about 0.1 to 50 B₁ units per unit of A—N₂X.

This class of diazo compounds is more fully described in U.S. Pat. No. 3,849,392 which is incorporated herein by reference.

DETAILED DESCRIPTION OF THE PREFERRED EMBODIMENT

As the first step in the production of the photographic element, one uses a sheet substrate such as aluminum and the alloys thereof, especially those aluminum compositions suitable for the manufacture of lithographic printing plates such as Alcoa 3003 and Alcoa 1100. The sheet may or may not have been pretreated by standard graining and/or etching and/or anodizing techniques as are well known in the art. It also may or may not have been treated with a composition, such as polyvinyl phosphonic acid, suitable for use as a hydrophilizing layer for lithographic plates. The element is then coated with the radiation sensitive diazo composition disclosed herein.

The photosensitive sheet material is then exposed through a mask or transparency, to a radiation source and the exposed sheet then developed for removal of unexposed photosensitive materials.

The light sensitive composition comprises an admixture of a diazonium salt belonging to two distinct classes, a polyvinyl acetate resin, and a styrene/maleic acid half ester copolymer. The mixture is usually prepared in a solvent composition which is compatible with all the composition ingredients. The composition is then coated on the substrate and the solvent dried off. The composition may also contain other art recognized ingredients such as colorants, acid stabilizers and exposure indicators.

The most preferred Type 1 diazonium salt is the two-step condensation product of the homocondensate of 4,4'-bis-methoxy methyl diphenyl ether and 3-methoxy-4-diazo-diphenyl amine sulfate, precipitated as the mesitylene sulfonate salt. This is fully taught in U.S. Pat. No. 4,436,804.

A most preferred Type 2 diazonium salt is the polycondensation product of 3-methoxy-4-diazo-diphenyl amine sulfate and 4,4'-bis-methoxy methyl-diphenyl ether, precipitated as mesitylene sulfonate salt, as taught in U.S. Pat. No. 3,849,392.

The polyvinyl acetate resin useful for the practice of the present invention has an average molecular weight in the range of from about 100,000 to less than 800,000. A preferred molecular weight maximum is about 700,000; more preferably about 680,000. The most preferred average molecular weight is in the range of about 100,000 to 380,000. Polyvinyl acetate resins useful within the context of the invention non-exclusively include Mowilith(R) 25, 30, 50 and 60 available from Hoechst AG, Frankfurt, West Germany.

The styrene/maleic acid half ester copolymer useful within the context of the present invention has the general formula:

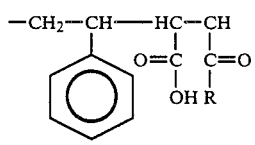

wherein R is a lower aliphatic alcohol residue having from 1 to about 5 carbon atoms. A styrene component always appears as end-capping members of the copolymer chain. Therefore the ratio of styrene to maleic acid half ester in the copolymer is 1:<1.

The copolymer has an average molecular weight of not more than about 50,000, and is preferably less than about 50,000.

Preferably, the average molecular weight falls in the range of from about 10,000 to about 50,000. One particularly preferred copolymer useful within the context of the present invention is Scripset(R) 540, available from Monsanto, which has an approximate average molecular weight of about 20,000.

Suitable acid stabilizers useful within the context of the present invention include phosphoric, citric, tartaric and p-toluene sulfonic acids.

Exposure indicators useful in conjunction with the present invention include para phenyl azo diphenyl amine, Calcozine Fuchine dyes and Crystal Violet and Methylene Blue dyes.

Non-limiting examples of colorants useful with the photographic element of the present invention include such dyes as Acetosol Fire Red 3GLS, Sandolan Eosin E-G, Acetosol Green BLS, Genacryl Blue 3G, Sandolan Cyanine N-6B, Sandoplast Blue R, Atlantic Alizarine Milling Blue FFR 200, Neozapon Fiery Red BL, Erythrosine, Methylene Blue IaD Extra, Victoria Pure Blue FGA; and such pigments as Green Gold Pigment and Sunfast Violet.

The total amount of the diazonium salts which are in the coating composition are preferably present in an amount of from about 20% to about 50% by weight of the solid composition components. A more preferred range is from about 25% to 45% and most preferably from about 30% to 40%.

The ratio of Type 1 diazo to Type 2 diazo is preferably in the range of from 1 to about 0.95-1.45; more preferably from 1 to about 1.10-1.35; and most preferably from 1 to about 1.20-1.30.

The polyvinyl acetate resin is preferably present in the coating composition in an amount of from about 8% to about 33% by weight of the solid composition components. A more preferred range is from about 12% to 28% and most preferably from about 18% to 23%.

The styrene/maleic acid half ester copolymer is preferably present in the coating composition in an amount of from about 25% to about 55% by weight of the solid composition components. A more preferred range is from about 32% to 48% and most preferably from about 37% to 43%.

The acid stabilizer, when one is used, is preferably present in the coating composition in an amount of from about 1.5% to about 4.5% by weight of the solid composition components. A more preferred range is from about 2.0% to 4.0% and most preferably from about 2.5% to 3.5%.

The exposure indicator, when one is used, is preferably present in the coating composition in an amount of from about 0.05% to about 0.35% by weight of the solid composition components. A more preferred range is from about 0.10% to 0.30% and most preferably from about 0.15% to 0.25%.

The colorant, when one is used, is preferably present in the coating composition in an amount of from about 0.25% to about 0.55% by weight of the solid composition components. A more preferred range is from about 0.30% to 0.50% and most preferably from about 0.35% to 0.45%.

Suitable solvents which may be used as a medium to combine the ingredients of the present composition include Methyl Cellosolve, ethylene glycol ethers, butyrolactone, such alcohols as ethyl alcohol and n-propanol, and ketones such as methyl ethyl ketone. In general said solvents are evaporated from the coating once it is applied to an appropriate substrate, however, some insignificant amount of solvent may remain as a residue.

Substrates useful for production of the photographic element of the present invention non-exclusively include transparent films, aluminum alloys, silicon and similar materials which are well known in the art.

In the production of lithographic printing plates, an aluminum containing substrate is first preferably grained by art recognized methods such as by means of a wire brush, slurry of particulates or electrochemical means, for example in a hydrochloric acid electrolyte. The grained plate may then be anodized, for example, in sulfuric or phosphoric acid in a manner well known in the art. The grained and anodized surface may then be rendered hydrophilic, for example, by treatment with polyvinyl phosphonic acid, sodium silicate, or the like, which means are also known to skilled artisans. The thusly prepared plate is then coated with the composition of the present invention, dried, exposed to actinic radiation through an appropriate mask and developed with an aqueous based developer.

A suitable developer useful for the photographic element of the present invention includes an aqueous alkaline solution containing (a) a sodium, potassium or lithium salt of octyl, decyl or dodecyl monosulfate;

(b) a sodium, lithium, potassium or ammonium metasilicate salt; and (c) a lithium, potassium, sodium or ammonium borate salt; and (d) an aliphatic dicarboxylic acid, or sodium, potassium or ammonium salt thereof having from 2 to 6 carbon atoms; and (e) di- and/or tri-sodium or -potassium phosphate.

The following non-limiting examples serve to illustrate the invention.

EXAMPLE 1

A coating solution is prepared according to the following composition:

| | | % (w/w) |
|---|---|---|
| 1 | ethylene glycol monomethyl ether | 86.035 |
| 2 | phosphoric acid (85%) | 0.445 |
| 3 | Mowilith 60 | 2.669 |
| 4 | Scripset 540 | 5.562 |
| 5 | 4-phenyl azo diphenyl amine | 0.033 |
| 6 | Acetosol Fire Red | 0.250 |
| 7 | Diazo Type 1 compound prepared by the condensation of a 2.5 mole homocondensation product of 4,4'-bis methoxy methyldiphenyl ether and 1 mole of 3-methoxy-4-diazo diphenyl amine sulfate isolated as the mesitylene sulfonate salt. | 2.225 |
| 8 | Diazo Type 2 compound prepared by the 1:1 mole condensation of 3-methoxy-4-diazo diphenyl amine sulfate and 4,4'-bis methoxy methyl diphenyl ether, isolated as the mesitylene sulfate salt. | 2.781 |
| | | 100.000 |

The above ingredients are added sequentially in 450 g of Methyl Cellosolve (monoethyl ether of ethylene glycol) with vigorous stirring. After all the ingredients are dissolved, the solution is filtered and whirler coated at 70 rpm on a slurry grained and hydrophilized aluminum surface. Upon drying, the plate is exposed in a Berkey/Ascor (24"×28") exposure unit through negative film using 115 mJ/cm² so as to obtain a printed solid step 6 on a standard Stouffer 21 stepwedge. The exposed plate is developed with an aqueous alkaline developer containing the following ingredients

|  | % (w/w) |
| --- | --- |
| H₂O | 91.7 |
| sodium octyl sulfate | 2.5 |
| sodium metasilicate | 0.1 |
| disodium phosphate | 1.5 |
| trisodium phosphate | 1.5 |
| potassium oxalate | 1.7 |
| potassium tetraborate | 1.0 |
|  | 100.0 | which removes the unexposed areas, leaving the exposed areas as image. The plate is rinsed with an aqueous solution containing about 10% of hydrolyzed tapioca starch and 0.5% of phosphoric acid. The prepared plate is mounted on an offset sheet fed press under normal printing conditions and it provides 45,000 quality impressions.

EXAMPLE 2

Example 1 is repeated except only the Type 2 diazo compound is used at the combined percentage level of 5.006%. 240 mj/cm² of energy is required upon exposure to obtain a printed solid step 6 on a standard Stouffer 21 stepwedge. The prepared plate is mounted on an offset sheet-fed press under normal printing conditions and it provides 30,000 quality impressions.

EXAMPLE 3

Example 1 is repeated except only the Type 1 diazo compound is used at the combined percentage level of 5.006%. 180 mj/cm² of energy is required upon exposure to obtain a printed solid step 6 on a standard Stouffer 21 stepwedge. The prepared plate is mounted on an offset sheet-fed press under normal printing conditions and it provides 8,000 quality impressions.

EXAMPLE 4

Example 1 is repeated except the described solution is coated on an electrochemically grained, anodized and hydrophilized aluminum surface. The prepared plate is mounted on an offset sheet fed press, under normal printing conditions, and it provides 265,000 quality impressions.

EXAMPLE 5

Example 2 is repeated except the described solution is coated on an electrochemically grained, anodized and hydrophilized aluminum surface. The prepared plate is mounted on an offset sheet-fed press under normal printing conditions, and it provides 205,000 quality impressions.

EXAMPLE 6

Example 3 is repeated except the described solution is coated on an electrochemically grained, anodized and hydrophilized aluminum surface. The prepared plate is mounted on an offset sheet-fed press under normal printing conditions, and it provides 40,000 quality impressions.

What is claimed:
1. A photosensitive composition which comprises in admixture: a polyvinyl acetate resin having an average molecular weight in the range of from about 100,000 to less than about 800,000; a styrene end-capped copolymer of the formula

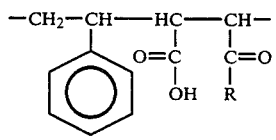

wherein R is a lower aliphatic alcohol residue having from 1 to about 5 carbon atoms and wherein said polymer has an average molecular weight of not more than about 50,000; at least one light sensitive, negative working diazonium salt Diazo 1 which is a light sensitive, substantially linear polymeric diazonium reaction compound comprising repeating units of the condensation product of each of the general types E⁺X⁻ and Q, in which E⁺X⁻ is a radical of the compound of the general formula:

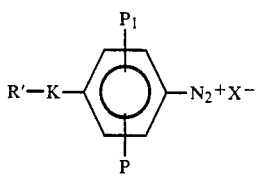

wherein:
—K— is selected from the group consisting of

—S—, —O—, and —CH₂—, or is absent;
R' is selected from the group consisting of phenyl and C₁ to C₄ alkyl substituted phenyl;
P and P₁ are selected from the group consisting of C₁ to C₄ alkyl, methoxy, ethoxy, butoxy, or H;
P₁ may be the same as P or different; and
X⁻ is an anion;
and Q is a radical of an oligomer having the structure:

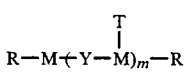

wherein:
R is selected from the group consisting of

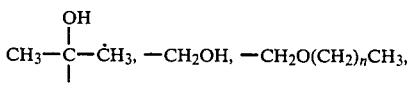

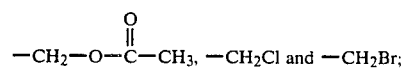

n is an integer from 0 to 3;
M is an aromatic radical selected from the group consisting of aromatic hydrocarbons, diaryl ethers, diaryl sulfides, diaryl sulfones, diaryl amines, diaryl ketones and diaryl diketones;
m is 1 to 6;
Y is selected from the group consisting of —CH₂— or —CH₂—O—CH₂—bridge; and T is the same as R when Y=—CH$_2$— and H— when Y=—CH$_2$—O—CH$_2$— wherein said diazonium compound is prepared by a two-step process consisting essentially of forming a precondensed oligomer component Q and reacting said component Q with radical E$^+$X$^-$ such that the ratio of M to E$^+$X$^-$ is at least 2:1; and at least one light sensitive, negative working diazonium salt Diazo 2 which is a light sensitive diazonium compound prepared by reacting in the absence of added paraformaldehyde at least one A—N$_2$X compound and at least one B$_1$ compound of the formula E(—CHR$_a$—OR$_b$)$_m$ in which A—N$_2$X is a radical of a compound selected from the group consisting of a compound of the formula

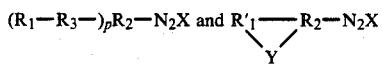

wherein
R$_1$ is a phenyl or naphthyl group
R'$_1$ is a phenylene or naphthylene group
R$_2$ is a phenylene group
R$_3$ is a single bond or one of the groups
—(CH$_2$)$_q$—NR$_4$—
—O—(CH$_2$)$_r$—NR$_4$—
—S—(CH$_2$)$_r$—NR$_4$—
—S—CH$_2$—CO—NR$_4$—
—O—R$_5$—O—
—O—
—S— or
—CO—NR$_4$—
the left-hand free valence of the specified groups is attached to R$_1$ and the right-hand free valence is attached to R$_2$,
wherein
q is a number from 0 to 5
r is a number from 2 to 5
R$_4$ is selected from the group consisting of hydrogen, alkyl with 1 to 5 carbon atoms, aralkyl with 7 to 12 carbon atoms, and aryl with 6 to 12 carbon atoms,
R$_5$ is an arylene group having 6 to 12 carbon atoms
Y is one of the groups —NH—, and —O—
X is an anion
p is a number from 1 to 3
E is a radical obtained by splitting off of m H atoms from a compound free of diazonium group selected from the group consisting of aromatic amines, phenols, thiophenols, phenyl ethers, aromatic thioethers, aromatic heterocyclic compounds, aromatic hydrocarbons and organic acid amides,
R$_a$ is selected from the group consisting of hydrogen and phenyl,
R$_b$ is selected from the group consisting of hydrogen, alkyl,

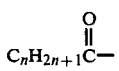

wherein n is from 0 to 3 and a phenyl group, and m is an integer from 1 to 10
in a strongly acidic condensation medium and under condensation conditions sufficient to produce a polycondensation product of an aromatic diazonium compound containing, on the average, about 0.1 to 50 B$_1$ units per unit of A—N$_2$X, wherein the total amount of the diazonium compounds ranges from about 20% to about 50% by weight of the composition, and the ratio of Diazo 1 to Diazo 2 is in the range of 1 to about 0.95–1.45; and wherein the polyvinyl acetate resin is present in the amount of from about 8% to about 33%; and wherein the styrene/maleic acid half ester copolymer is present in an amount of from about 25% to about 55% by weight of said composition.

2. The composition of claim 1 wherein the said copolymer has an average molecular weight in the range of from about 10,000 to about 50,000.

3. The composition of claim 1 wherein the said resin has an average molecular weight in the range of from about 100,000 to about 700,000.

4. The composition of claim 1 wherein the said resin has an average molecular weight in the range of from about 100,000 to about 380,000.

5. The composition of claim 1 wherein Diazo 1 is the condensation product of the homocondensate of 4,4'-bismethoxy methyl diphenyl ether and 3-methoxy-4-diazo-diphenyl amine sulfate, precipitated as the mesitylene sulfonate salt.

6. The composition of claim 1 wherein Diazo 2 is the polycondensation product of 3-methoxy-4-diazo-diphenyl amine sulfate and 4,4'-bis-methoxy methyl-diphenyl ether, precipitated as mesitylene sulfonate.

7. The composition of claim 1 wherein the said resin has an average molecular weight in the range of from about 100,000 to about 380,000; and said polymer has an average molecular weight in the range of from about 10,000 to about 50,000; and wherein Diazo 1 is the condensation product of the homocondensate of 4,4'-bismethoxy methyl diphenyl ether and 3-methoxy-4-diazo-diphenyl amine sulfate, precipitated as the mesitylene sulfonate salt and wherein Diazo 2 is the polycondensation product of 3-methoxy-4-diazo-diphenyl amine sulfate and 4,4'-bis-methoxy methyl-diphenyl ether, precipitated as mesitylene sulfonate.

8. The composition of claim 1 further comprising one or more ingredients selected from the group consisting of exposure indicators, acid stabilizers and colorants.

9. A photosensitive element which comprises a substrate and the composition of claim 1 on said substrate.

10. A lithographic printing plate which comprises an aluminum containing substrate and the composition of claim 1 coated on said substrate.

11. A lithographic printing plate which comprises an aluminum containing substrate and the composition of claim 7 coated on said substrate.

12. A lithographic printing plate which comprises an aluminum containing substrate, at least one surface of which has been grained, anodized and hydrophilized; and the composition of claim 1 coated onto said treated surface.

13. A lithographic printing plate which comprises an aluminum containing substrate, at least one surface of which has been grained, anodized and treated with a polyvinyl phosphoric acid containing hydrophilizing composition; and the composition of claim 7 coated onto said treated surface.

14. A lithographic printing plate which comprises an aluminum containing substrate, at least one surface of which has been grained and hydrophilized; and the composition of claim 1 coated onto said treated surface.

* * * * *